US009034720B2

(12) United States Patent
Liu et al.

(10) Patent No.: US 9,034,720 B2
(45) Date of Patent: May 19, 2015

(54) LITHO SCANNER ALIGNMENT SIGNAL IMPROVEMENT

(75) Inventors: Hui Liu, Singapore (SG); Wen Zhan Zhou, Singapore (SG); Zheng Zou, Singapore (SG); Qun Ying Lin, Singapore (SG); Alex Kai Hung See, Singapore (SG)

(73) Assignee: GLOBALFOUNDRIES SINGAPORE PTE. LTD., Singapore (SG)

(*) Notice: Subject to any disclaimer, the term of this patent is extended or adjusted under 35 U.S.C. 154(b) by 292 days.

(21) Appl. No.: 13/588,018

(22) Filed: Aug. 17, 2012

(65) Prior Publication Data

US 2014/0050439 A1    Feb. 20, 2014

(51) Int. Cl.
*H01L 21/76*   (2006.01)
*G02B 6/136*   (2006.01)
*G03F 7/20*    (2006.01)
*G02B 6/124*   (2006.01)

(52) U.S. Cl.
CPC ............... *G02B 6/136* (2013.01); *G02B 6/124* (2013.01); *G03F 7/70633* (2013.01)

(58) Field of Classification Search
CPC ....... G03F 7/70633; G02B 6/124; G02B 6/126
USPC ................................................. 438/32, 401
See application file for complete search history.

(56) References Cited

U.S. PATENT DOCUMENTS

| 5,696,374 A | * | 12/1997 | Fukui et al. | 250/237 G |
| 2005/0231732 A1 | * | 10/2005 | Monshouwer et al. | 356/508 |
| 2009/0153861 A1 | * | 6/2009 | Musa et al. | 356/401 |
| 2012/0093190 A1 | * | 4/2012 | Onishi | 372/50.11 |

* cited by examiner

*Primary Examiner* — Long K Tran
(74) *Attorney, Agent, or Firm* — Ditthavong & Steiner, P.C.

(57) ABSTRACT

A method and a device are provided for diffracting incident light from a lithographic scanner in an IC process flow. Embodiments include forming a diffraction grating in a first layer on a semiconductor substrate; and forming a plurality of lithographic alignment marks in a second layer, overlying the first layer, wherein the diffraction grating has a width and a length greater than or equal to a width and length, respectively, of the plurality of lithographic alignment marks.

17 Claims, 6 Drawing Sheets

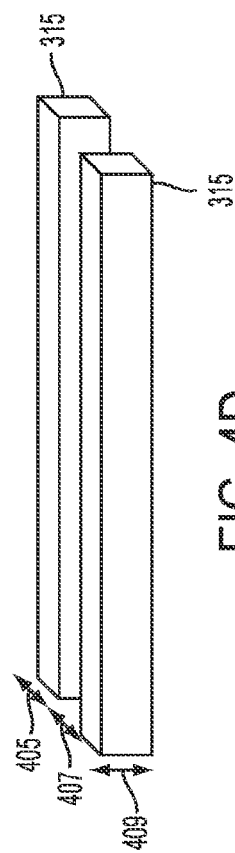
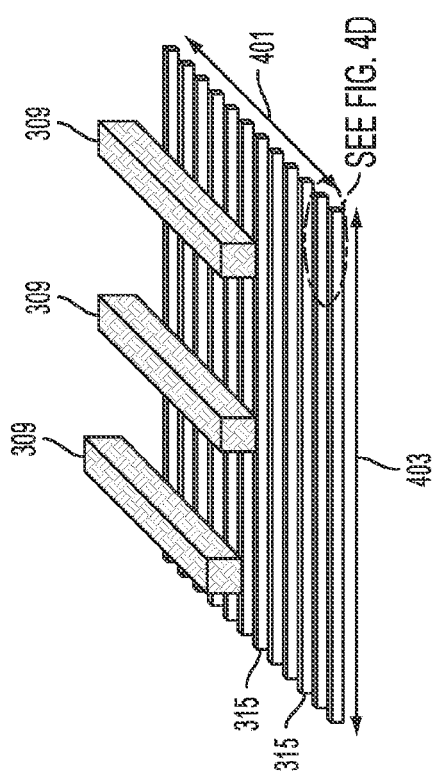
FIG. 4D
FIG. 4C

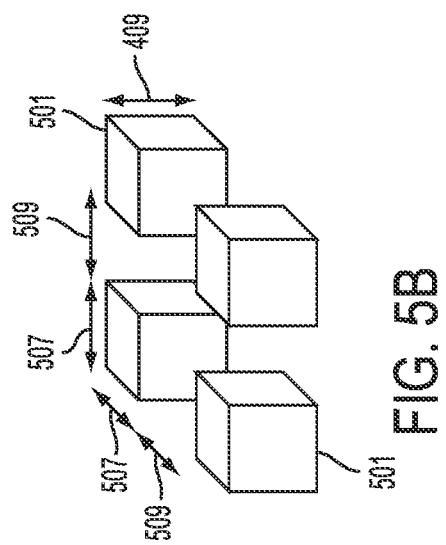
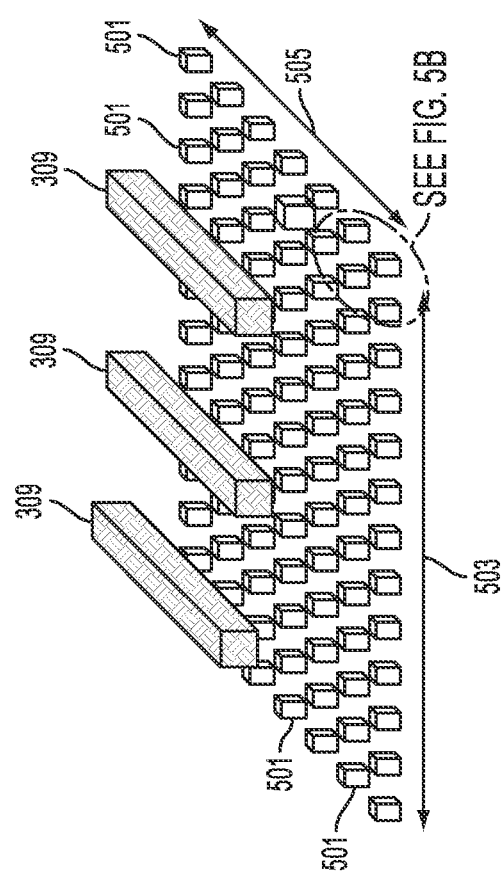

US 9,034,720 B2

LITHO SCANNER ALIGNMENT SIGNAL IMPROVEMENT

TECHNICAL FIELD

The present disclosure relates to semiconductor device overlay alignment processes. The present disclosure is particularly applicable to semiconductor alignment processes for 12 inch (300 nm) technology nodes and beyond.

BACKGROUND

Integrated circuits (ICs) are generally formed by printing several patterns, each in a separate photo layer, on a semiconductor substrate. During an IC process flow, before printing the pattern for each photo layer on the semiconductor substrate, a lithographic scanner must first align pre-layer alignment marks (on the preceding layer) to determine the exact location of the wafer and the pre-layer pattern shift status. The basic principle of lithographic scanner alignment is based on light diffraction and interference phenomena. More specifically, a lithographic scanner scans pre-layer alignment marks using a single color laser. Then, different signal strengths are produced by light diffraction and interference between incident and reflected light and captured by the lithographic scanner to determine the location of the wafer and the pattern on the wafer.

The incident light from the lithographic scanner can penetrate through most layers of the semiconductor substrate. As a result, reflected light is produced at every interface between layers. Moreover, where multiple photo layers make up the semiconductor substrate, the phase depth is thick, and the variations among the layers can cause unstable phase shifts. In particular, different light phase shifts will induce different signal strength. Therefore, to produce a stable alignment signal, as required to control overlay performance, the phase shift among all reflected light must also be kept stable.

A known approach to reduce the phase shift inherent to alignment processes for a semiconductor substrate with multiple photo layers is to form large grating elements in a layer in advance of and in the same location as alignment marks formed in the subsequent overlying layer. For example, as illustrated in FIG. 1, photolayers 103, 105, and 107 are printed on a semiconductor substrate to form an IC pattern. Before printing a pattern for current layer 107, a lithographic scanner (not shown for illustrative convenience) must align lithographic alignment marks 109 printed on layer 105 to obtain the exact wafer location and the pre-layer pattern shift status. To reduce the phase depth from the total thickness of layers 101, 103, and 105 to phase depth 119, a grating 115 is formed on layer 103 under the alignment marks 109. Some of the incident light 111 from the lithographic scanner passes through the photoresist 113 and the photo layers 107 and 105, reaching large grating 115, which blocks light from passing to underlying layers, such as 103 and 101. As a result, when the scanner aligns the alignment marks, the incident light from the lithographic scanner can only penetrate through one layer and will be reflected completely by the underlying grating due to the large grating size (e.g., 1 to 9 microns (μm)). The incident light 111 reflected by the large grating 115 adds to reflected light 117. Consequently, the phase depth is reduced to the thickness of one layer, and the alignment signal is more stable. However, because some light is still reflected back to the lithographic scanner some instability of the alignment signal still remains, degrading overlay performance.

A need therefore exists for methodology enabling further stabilization of an alignment signal for lithographic printing of IC photo layers, and a resulting device.

SUMMARY

An aspect of the present disclosure is a method of forming a diffraction grating in a layer underlying lithographic alignment marks.

Another aspect of the present disclosure is a semiconductor device including a diffraction grating underlying lithographic alignment marks c.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a diffraction grating in a first layer on a semiconductor substrate; and forming a plurality of lithographic alignment marks in a second layer, overlying the first layer, wherein the diffraction grating has a width and a length greater than or equal to a width and length, respectively, of the plurality of lithographic alignment marks.

Aspects of the present disclosure include forming the diffraction grating and the plurality of lithographic alignment marks in an area which includes no IC pattern on the first or second layer. Other aspects include forming the diffraction grating in a layer directly underneath the layer containing the plurality of lithographic alignment marks. Further aspects include forming elements of the diffraction grating in a direction parallel to a direction of the plurality of lithographic alignment marks. Additional aspects include forming elements of the diffraction grating in a direction perpendicular to a direction of the plurality of lithographic alignment marks. Further aspects include forming an IC pattern on the first layer concurrently with forming the diffraction grating, and forming the diffraction grating to a depth equal to a depth of the IC pattern.

Another aspect of the present disclosure is a method including: forming a diffraction grating as a square array of grating elements in a first layer on a semiconductor substrate; and forming a plurality of lithographic alignment marks on a second layer, overlying the first layer, wherein the square array has a width and a length greater than or equal to a width and length of the plurality of alignment marks. Other aspects include forming the diffraction grating and the plurality of lithographic alignment marks in an area which includes no IC pattern on the first or second layer. Further aspects include forming the square array in a layer directly underneath the layer containing the plurality of lithographic alignment marks. Additional aspects include forming each grating element of the square array with an identical width and length. Further aspects include forming an IC pattern on the first layer concurrently with forming the diffraction grating, and forming the diffraction grating to a depth equal to a depth of the IC pattern. Another aspect includes lithographically forming the IC pattern and the diffraction grating on the first layer.

A further aspect of the present disclosure is a device including: a semiconductor substrate; a first layer on the semiconductor substrate, the first layer including a diffraction grating; and a second layer overlying the first layer, the second layer including a plurality of lithographic alignment marks directly above diffraction grating, wherein the diffraction grating has a width and a length greater than or equal to a width and length, respectively, of the plurality of lithographic alignment marks. Other aspects include the diffraction grating and the plurality of lithographic alignment marks being positioned in an area of the semiconductor substrate which includes no IC pattern on the first or second layer. Further aspects include the first layer, including the diffraction grating, being directly underneath the second layer, containing the plurality of lithographic alignment marks. Additional aspects include the elements of the diffraction grating being in a direction parallel to a direction of the plurality of lithographic alignment marks. Further aspects include the elements of the diffraction grating being in a direction perpendicular to a direction of the plurality of lithographic alignment marks. Another aspect includes an IC pattern on the first layer and the diffraction grating having a depth equal to a depth of the IC pattern. Other aspects include the diffraction grating being in a border region around the IC pattern. Further aspects include a second diffraction grating on the second layer remote from the IC pattern and the plurality of lithographic alignment marks; a third layer overlying the second layer; and a second plurality of alignment marks on the third layer directly above the second diffraction grating.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 3 through 5 schematically illustrate a portion of a semiconductor device including a diffraction grating for diffracting incident light from a lithographic scanner in an IC process flow, with FIGS. 4B, 4D, and 5B showing enlarged views of FIGS. 4A, 4C, and 5A, respectively, in accordance with an exemplary embodiment of the present disclosure.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of a phase shift of reflected light attendant upon lithographic scanner alignment processes, which destabilizes the alignment signal required to control overlay performance between layers in a IC process flow. In accordance with embodiments of the present disclosure, a diffraction grating is formed under alignment marks, so that most of the incident light that passes through the alignment mark layer is diffracted and does not interfere with the alignment signal, thereby improving overlay performance.

Methodology in accordance with embodiments of the present disclosure includes forming a diffraction grating in a first layer on a semiconductor substrate; and forming a plurality of lithographic alignment marks in a second layer, overlying the first layer, wherein the diffraction grating has a width and a length greater than or equal to a width and length, respectively, of the plurality of lithographic alignment marks.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
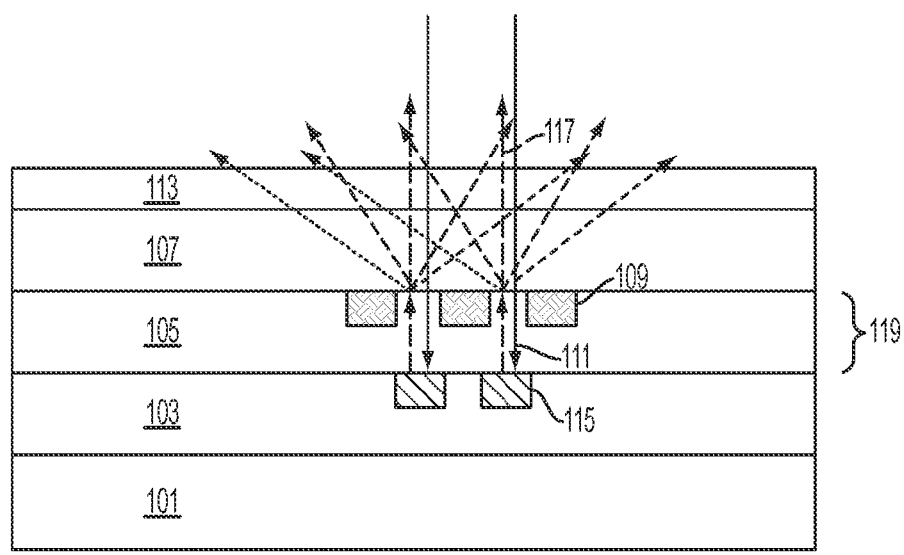
FIG. 1 schematically illustrates a current semiconductor device for reducing a phase depth of incident light from a lithographic scanner in an IC alignment process flow.
Figure 2:
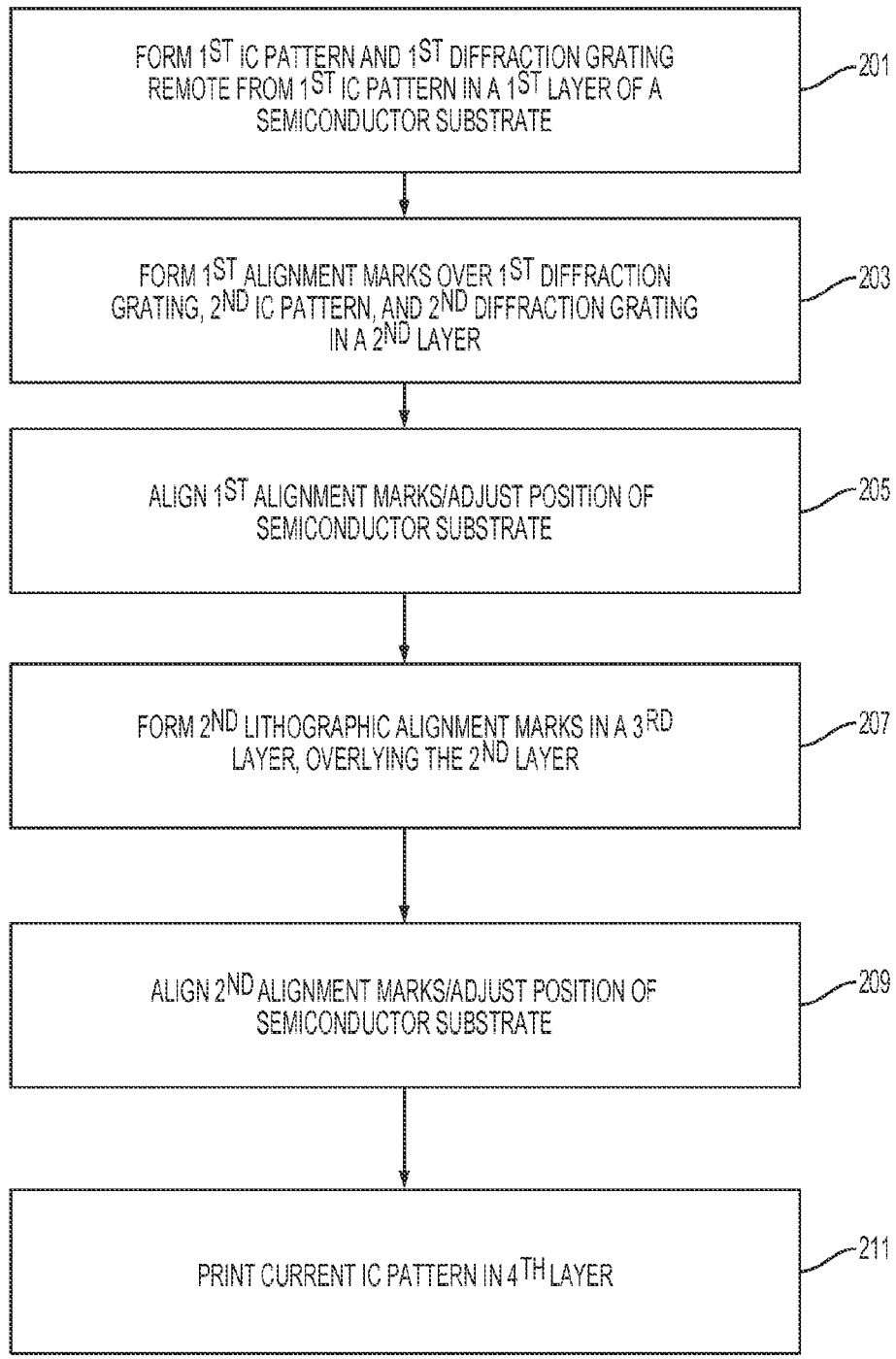
FIG. 2 illustrates a process flows for forming a semiconductor device including diffracting incident light from a lithographic scanner in an IC alignment process flow, in accordance with an exemplary embodiment of the present disclosure.
Figure 3:
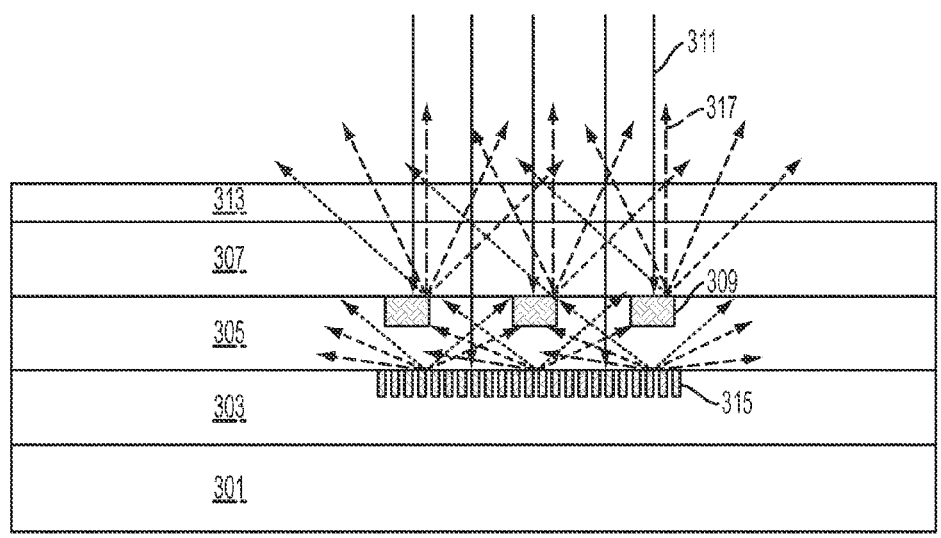
Figure 4B:
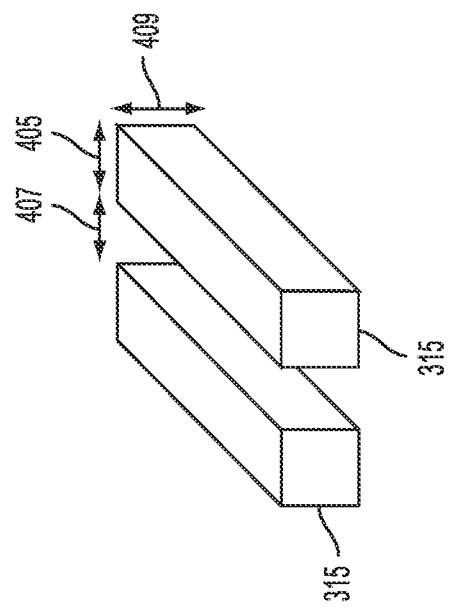
Figure 4A:
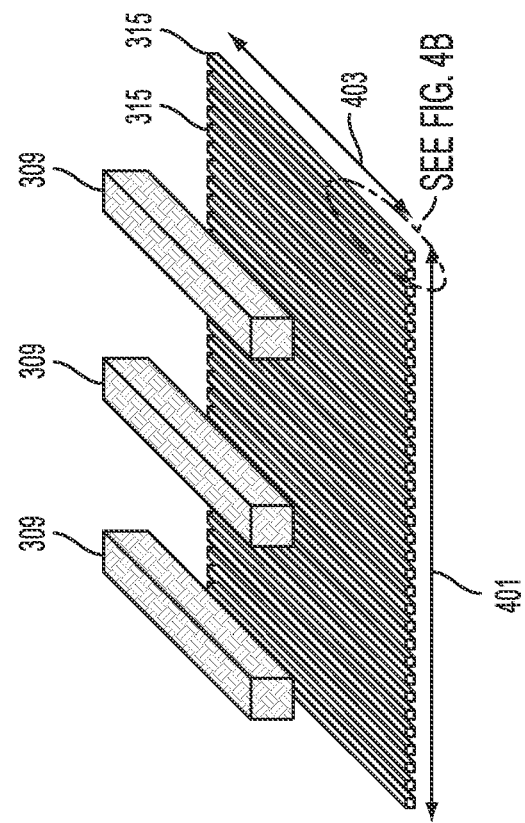

FIG. 2 illustrates a process flow for forming a semiconductor device including diffracting incident light from a lithographic scanner in an IC alignment process flow, in accordance with an exemplary embodiment of the present disclosure. Adverting to step 201, in conjunction with FIGS. 3 and 4, a diffraction grating 315 and first IC pattern (not shown for illustrative convenience) are formed in a first layer 303 over wafer 301 of a semiconductor substrate. More specifically, a grating pattern and an IC pattern are laid out together on a lithography reticle (not shown for illustrative convenience) and the diffraction grating 315 and the IC pattern are printed concurrently on layer 303 of the semiconductor substrate, to an equal depth, for example depth 409 as depicted in FIGS. 4A and through 4D, using the same process flow and conditions, for example lithography, ion beam etch, etc. The grating depth 409 when printed in a polysilicon layer concurrently with a polysilicon IC pattern (such as polysilicon gate electrodes) is, for example, around 800 angstroms (Å), and the grating depth when printed in metal concurrently with a metal IC pattern (such as metal lines) is, for instance, around 1800 Å. Moreover, while the individual width 405 and spacing 407 of the elements of the diffraction grating 315, as depicted in FIGS. 4A through 4D, are designed as small as possible based on the particular wavelength of the light of a lithographic scanner (not shown for illustrative convenience) and the process capability, the diffraction grating 315 has an overall width 401 and an overall length 403 greater than or equal to a width and length, respectively, of the plurality of lithographic alignment marks 309 as illustrated in FIGS. 4A through 4D and. The patterns for forming the diffraction grating 315 (and the lithographic alignment marks 309) are laid on the lithography reticle (not shown for illustrative convenience) in an area that will not affect the first IC pattern, for example in a border region around the first IC pattern.

In step 203, a second IC pattern and second diffraction grating (both not shown for illustrative convenience) along with a plurality of first lithographic alignment marks 309 are formed in layer 305 directly over the first diffraction grating 315. The diffraction grating 315 may be formed in a number of directions relative to the subsequently formed lithographic alignment marks 309. For example, the elements of the first diffraction grating 315 may be formed in a direction parallel to the direction of the plurality of first lithographic alignment marks 309 as depicted in FIGs. 4A and 4B. In contrast, the elements of the first diffraction grating 315 may be formed in a direction perpendicular to the direction of the plurality of first lithographic alignment marks 309 as depicted in FIGs. FIGs.4C and 4D.

The second diffraction grating is formed in a location remote from the first alignment marks 309 and in an area that will not affect the IC pattern. In particular, the pattern for forming the first lithographic alignment marks 309 is laid on the lithography reticle and is formed using the same process flow and conditions that are used to form the second diffraction grating 315 and second IC pattern, for example lithography, ion beam etch, etc.

Adverting to step 205, a lithographic scanner scans the alignment marks 309, detects light reflected and diffracted by the alignment marks, determines the position of the wafer and IC pattern(s). The first alignment marks are aligned and the position of the semiconductor substrate is adjusted. Then, a third IC pattern may be patterned in step 207 in a third layer based on the adjusted position. Concurrently with the third IC pattern, second alignment marks are printed over the second diffraction grating.

In step 209, the lithographic scanner uses the second set of alignment marks to determine the position of the wafer and location of IC patterns, and the semiconductor substrate position is adjusted accordingly. Then, the current IC pattern may be printed in a fourth layer in step 211. The steps of forming a diffraction grating, forming alignment marks over the diffraction grating, and printing an IC pattern may be repeated for each IC pattern to be printed on the wafer.

FIGs. 5A and 5B illustrate a diffraction grating 501 in accordance with another exemplary embodiment. The diffraction grating 501 is formed as a square array and may be employed for the first and second diffraction gratings formed in steps 201 and 203 described above. For example, the diffraction grating 501 may he formed on a first layer 303 of a semiconductor substrate, to an equal depth, for example depth 409, as the, IC pattern formed in the same layer. Moreover, while the individual width 507 and spacing 509 of the elements of the diffraction grating 501 are again designed and formed as small as possible based on the particular wavelength of the light of a lithographic scanner (not shown for illustrative convenience) and the process capability, the diffraction grating 501 has an overall width 503 and an overall length 505 greater than or equal to a width and length, respectively, of the plurality of lithographic alignment marks 309 as depicted in FIGs. 5A and 5B. Further, each grating element of the diffraction grating 501 has an identical width and length 507.

The embodiments of the present disclosure can achieve several technical effects including improving the stability of an alignment signal and, therefore, improving the overlay performance between layers in the whole IC process flow. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure enjoys industrial applicability in any of various types of highly integrated semiconductor devices, particularly 12 inch (300 nm) technology nodes and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    forming a diffraction grating in a first layer on a semiconductor substrate;
    forming a plurality of lithographic alignment marks in a second layer, overlying the first layer,
    wherein the diffraction grating has a width and a length greater than or equal to a width and length, respectively, of the plurality of lithographic alignment marks; and
    forming an integrated circuit (IC) pattern on the first layer concurrently with forming the diffraction grating, and forming the diffraction grating to a depth equal to a depth of the IC pattern.

2. The method according to claim 1, comprising forming the diffraction grating and the plurality of lithographic alignment marks in an area which includes no integrated circuit (IC) pattern on the first or second layer.

3. The method according to claim 1, comprising forming the diffraction grating in a layer directly underneath the layer containing the plurality of lithographic alignment marks.

4. The method according to claim 1, comprising forming elements of the diffraction grating in a direction parallel to a direction of the plurality of lithographic alignment marks.

5. The method according to claim 1, comprising forming elements of the diffraction grating in a direction perpendicular to a direction of the plurality of lithographic alignment marks.

6. A method comprising:
    forming a diffraction grating as a square array of grating elements in a first layer on a semiconductor substrate;
    forming a plurality of lithographic alignment marks on a second layer, overlying the first layer, wherein the square array has a width and a length greater than or equal to a width and length of the plurality of alignment marks; and
    forming an integrated circuit (IC) pattern on the first layer concurrently with forming the diffraction grating, and forming the diffraction grating to a depth equal to a depth of the IC pattern.

7. The method according to claim 6, comprising forming the diffraction grating and the plurality of lithographic alignment marks in an area which includes no integrated circuit (IC) pattern on the first or second layer.

8. The method according to claim 6, comprising forming the square array in a layer directly underneath the layer containing the plurality of lithographic alignment marks.

9. The method according to claim 6, forming each grating element of the square array with an identical width and length.

10. The method according to claim 6, comprising lithographically forming the IC pattern and the diffraction grating on the first layer.

11. A device comprising:
a semiconductor substrate; a first layer on the semiconductor substrate, the first layer including a diffraction grating;
a second layer overlying the first layer, the second layer including a plurality of lithographic alignment marks directly above diffraction grating,
wherein the diffraction grating has a width and a length greater than or equal to a width and length, respectively, of the plurality of lithographic alignment marks; and
an IC pattern on the first layer, wherein the diffraction grating has a depth equal to a depth of the IC pattern.

12. The device according to claim 11, wherein the diffraction grating and the plurality of lithographic alignment marks are positioned in an area which includes no integrated circuit (IC) pattern on the first or second layer.

13. The device according to claim 11, wherein the first layer, including the diffraction grating, is directly underneath the second layer, containing the plurality of lithographic alignment marks.

14. The device according to claim 11, wherein elements of the diffraction grating are in a direction parallel to a direction of the plurality of lithographic alignment marks.

15. The device according to claim 11, wherein elements of the diffraction grating are in a direction perpendicular to a direction of the plurality of lithographic alignment marks.

16. the device according to claim 11, wherein the diffraction grating is in a border region around the IC pattern.

17. The device according to claim 11, further comprising:
a second diffraction grating on the second layer remote from the IC pattern and the plurality of lithographic alignment marks;
a third layer overlying the second layer; and
a second plurality of alignment marks on the third layer directly above the second diffraction grating.

* * * * *